United States Patent
Hladik et al.

[11] Patent Number: 6,088,405
[45] Date of Patent: Jul. 11, 2000

[54] OPTIMAL DECODER FOR TALL-BITING CONVOLUTIONAL CODES

[75] Inventors: Stephen Michael Hladik, Albany; John Bailey Anderson, Latham, both of N.Y.

[73] Assignee: Lockheed Martin Corporation, King of Prussia, Pa.

[21] Appl. No.: 09/232,039

[22] Filed: Jan. 15, 1999

[51] Int. Cl.[7] .......................... H04L 27/06; H03M 13/12
[52] U.S. Cl. .......................... 375/341; 714/786; 714/795
[58] Field of Search .................. 375/341, 340, 375/262, 265; 714/794, 795, 786

[56] References Cited

U.S. PATENT DOCUMENTS

5,721,745  2/1998  Hladik et al. .......................... 714/786
5,721,746  2/1998  Hladik et al. .......................... 714/786

*Primary Examiner*—Temesghen Ghebretinsae
*Attorney, Agent, or Firm*—W. H. Meise

[57] ABSTRACT

A decoder of digital data signals for a message sequence of N symbols from a data source, encoded with a tail-biting convolutional code, and for correcting all combinations of up to a preselected number e of bit errors, operates upon the sequentially-received collection of consecutive-encoded tail-biting data symbols and selects an unmerged decision depth LU(e), a forward decision depth LF(e) and then a decoder decision depth L, before executing in a processor of the Viterbi type, which has a decision depth of L trellis levels, a decoding algorithm for a total of (N+LF(e)+LU(e)) trellis stages to produce a decoded data bit output sequence representative of the N transmitted source digital symbols.

10 Claims, 7 Drawing Sheets

OPTIMAL DECODER FOR TAIL-BITING CONVOLUTIONAL CODES

FIELD OF THE INVENTION

The present invention relates to apparatus for decoding digital data signals used in data communications and, more particularly, to a novel decoder for digital data signals encoded with a tail-biting convolutional code. The invention will correct all combinations of up to a preselected number e of bit errors in a block of encoded data and reduce the overall error rate of the data.

BACKGROUND OF THE INVENTION

Many data and speech communications systems use digital data for organization and transmission of information. Digital data is often sent in short frames, packets or bursts, and digital systems generally require error detection and error correction to ensure reliable communication. In order to achieve such high reliability over noisy communication channels and storage media, convolutional codes have been developed and applied to successfully transmit and store digital data. In certain applications, it is desirable to transmit short frames or packets of data. Unfortunately, it is difficult to obtain powerful correction on short data packets.

Convolutional codes are an efficient and powerful class of error-correcting codes based on a trellis structure. A convolutional encoder is a finite-state machine driven by the data stream to be encoded. An encoder outputs successive groups of A encoder output bits for each group of B input bits (defining a B-group) received for transmission. The trellis serves as a record of all such A-group bit streams that may be output from the encoder, where the branches in the trellis correspond to permissible encoder state transitions and one A-group corresponds to each trellis branch. The A-groups that label the branches are a function of the specific encoder circuit used in a particular application.

In order to decode convolutionally-encoded information, a maximum-likelihood decoder determines which path through the trellis corresponds to the sequence of bits that was most likely sent by the encoder. To make such a determination, a decoder observes a certain trellis depth (or span) forward of the particular branch currently being decoded; this span may be the width of an entire message trellis or a portion thereof and is an encoder parameter known as the code's forward decision depth. The probability of a decoding error for a given trellis stage directly depends on the depth of observation forward of that branch; the decoding error probability decreases inversely with a span forward increase, until the span equals the code's forward decision depth. At this point, increasing the decoder observation depth does not yield any significant decrease in the probability of a decoding error. A problem arises when the decoder nears the end of a received code word; as the code word end is approached, there are not enough trellis stages forward of the branch being decoded for the decoder to properly decode the remaining bits with a similar low probability of error as at the beginning of the code word. Consequently, the decoder observation depth becomes necessarily shorter and the probability of error is elevated when the transmitted data frame itself is short.

There are currently several established methods for dealing with a poorly decoded end-section, including the tail-bit-termination method and the tail-biting method. The tail-bit-termination method appends extra bits (possibly known) to the sequence of message bits to be encoded in order to return the encoder to a known state. The decoder can utilize knowledge of the known last trellis state to reduce the probability of decoding error in the last segment of bits in a message.

However, use of the tail-bit-termination method is often a problem in applications requiring short data frames or bursts, such as in cellular communications, because of the increased code bits necessary to transmit a given data frame. Another technique, called the tail-biting method, alleviates the problem of adding additional bits to the end of a message by having the encoder start in a circuit state equal to the one that the encoder will end in. This may be accomplished by inserting the final m*B data bits of the message to be encoded into the encoder shift register, where m is the memory of the encoder, to initialize its state at the beginning of encoding so that the resulting output codeword is no longer a block of bits but rather is a circle that "bites its tail". By exploiting this property, a tail-biting decoder decodes all data with the same low probability of error. Tail-biting convolutional codes are the most efficient known class of short codes but, historically, decoding complexity has prevented their application on a broad scale.

Current tail-biting convolutional decoders, inclusive of the decoder first identifying the unknown starting state prior to initiating decoding, require significant microprocessor calculations, require more memory than standard decoding, are of higher complexity, and mandate repeated trellis traversals to properly decode the transmitted data frame. Accordingly, an improved decoder for digital data signals encoded with a convolutional tail-biting code is desired.

BRIEF SUMMARY OF THE INVENTION

In accordance with the invention, a novel decoder for data encoded with a tail-biting convolutional code, which is of lower computational complexity while performing as well or better than those appearing in the prior art, decodes received code words comprising N received symbols, which have traversed a noisy channel which may transform the code word generated by the encoder; each of the N transmitted encoder output symbols comprises A bits and is converted into a received symbol by the channel. For the case of an (A,B) trellis code, a tail-biting encoder generates this code word from a (B*N)-bit input message, i.e. N input symbols, each of B data bits. Our invention may be used with communication over any type of channel, such as a hard-decision (binary-output) channel or additive white Gaussian noise channel. The decoder utilizes: means for sequentially receiving a collection of N encoded data symbols; means for selecting a forward decision depth LF(e) of trellis stages for correcting up to e bit errors in the code word, where LF(e) is the first depth in the trellis at which all paths that descend from the set of incorrect branches extending from a correct path (the path transmitted by the encoder) initial node and not again touching the correct path are of a Hamming distance of more than 2e from the correct path; means for selecting an unmerged decision depth LU(e) of trellis stages for correcting up to e bit errors in the code word, where LU(e) is the first depth in the trellis at which all paths in the trellis that are independent of the correct path are a Hamming distance of more than 2e from the correct path; means for selecting a backward decision depth LB(e) of trellis stages for correcting up to e bit errors in the code word, where LB(e) is the first depth at which all paths that merge to the correct path initially at the trellis segment's rightmost node are a distance greater than 2e from the correct path; means for selecting each of a decoder initial processing width $W_I(e)$ and a terminal processing width $W_T(e)$ for correcting up to the preselected number e of errors in the bits of the code word, with each of $W_f(e)$ and $W_T(e)$ being determined from LF(e), LU(e), and LB(e); means for executing a processing algorithm of the Viterbi type on a collection of up to the first $W_f(e)$ encoded data symbols, to produce a permissible-state-representing-transitions trellis having $W_f(e)$ levels, each stage of the trellis including a plurality of possible states, with the connected state transitions representing paths through the trellis, each stage associated with an A-group of channel symbols and also pertaining to the B-group of data symbols received during those time periods; means for generating a path metric associated with each retained path in the trellis, wherein the path metric represents accumulation of branch metrics, where a branch metric is a measure of distance between symbols labeling a branch and the corresponding received symbols; means for causing the processing means to execute the processing algorithm over the next $W_T(e)$ levels until the forward edge reaches and includes level $(W_f(e)+W_T(e))$; means for further causing the processor means to execute the processing algorithm on the next N data symbols to extend the paths on the trellis to include level $(N+W_f(e)+W_T(e))$, wherein the last $(W_f(e)+W_T(e))$ received data symbols are identical to the first $(W_f(e)+W_T(e))$ received data symbols in the collection; means for selecting at each level, beginning at level $(W_f(e)+W_T(e))$ and tracing back $W_T(e)$ levels to reach a node P, a most likely path being a set of connected state transitions from P forward which most closely corresponds to symbols received during that interval; means for recording the value representing the state number of node P; means for causing the repetition of the executing, selecting and recording steps a total of N times, once for each subsequent level of the extended trellis until stage $(N+W_f(e)+W_T(e))$ is reached, to produce a decoded data bit output sequence derived from the state sequence and representing a decoded data signal of N transmitted trellis branches, correctly decoded; and means for then reordering the decoded data bits to reach the original chronological order representative of the transmitted source digital elements.

It is therefore an object of the present invention to provide a novel decoder for digital data signals which may have been corrupted by noise when the digital data signals are encoded with a convolutional tail-biting code.

"A decoder according to an aspect of the invention recovers data from a digital data signal. The digital data signal includes a plurality of N data symbols. Each of the N data symbols comprises A encoder output bits, which are generated in response to the input of B data bits into an encoder for a tail-biting trellis code. The decoder includes a receiving arrangement for receiving a sequence of the N encoded data symbols from a beginning symbol to a final symbol. The decoder also includes an arrangement for producing a circular sequence of received symbols. A processor is provided for executing a processing algorithm of the Viterbi type, having the decision depth L of trellis levels, on a sequence of the first $W_f(e)$ received symbols, for producing a trellis having $W_f(e)$ levels, with each level including a plurality of possible and permissible state transitions representing, when connected, one possible path through the trellis. The levels are established by the processor and algorithm in response to both (a) consecutive time periods and (b) the data symbols received during the time periods. The processor also includes a path generating arrangement for generating a path metric for the extension of each surviving path in the trellis, with the path metric representing a distance measurement between the extended path and the received sequence of symbols. A process continuation arrangement is provided for causing the processor to continue the processing algorithm on the next (N+L) data symbols, to extend the paths on the trellis to include the level $(W_f(e)+L+N)$, wherein the last $(W_f(e)+L)$ received data symbols are identical to the first $(W_f(e)+L)$ received data symbols in the collection as provided by the arrangement for producing a circular sequence of received symbols. In a preferred embodiment of the invention, the initial processing width $W_f(e)$ used in decoding is the larger of the unmerged decision depth LU(e) and the backward decision depth LB(e). A most likely path selection arrangement is provided for in processing arrangement, selecting at each level, beginning at level (L+1) and tracing back L levels to reach a node P, a most likely path which is a set of connected state transitions most closely corresponding to symbols received during the interval, A recording arrangement is provided for recording the B bits that label the transition to node P from the node at the preceding level, to produce a decoded data bit output signal beginning with trellis level $(W_f(e)+L+1)$. A control arrangement is provided for causing the recording arrangement to sequentially operate a total of (N-1) times for each subsequent level of the extended trellis paths until level $(N+L+W_f(e))$ is reached, to produce a decoded data bit signal N-bit output sequence.

According to a further aspect of the invention, the decoder filter includes a reordering arrangement for reordering the N decoded data bits to produce a decoded data bit output sequence in the chronological order corresponding to that of the encoded data bits."

This and the other objects of the invention, which provide a decoder for digital data signals which may have been corrupted by noise when the digital data signals are encoded with a convolutional tail-biting code that is compatible with many types of tail-biting convolutional codes, binary, trinary or more generally r-ary codes (whatever may be their efficiency rate and their constraint length), will become apparent upon reading the following description when considered in conjunction with the associated drawings.

BRIEF DESCRIPTION OF THE DRAWINGS

The subject matter which is regarded as the invention is particularly pointed out and distinctly claimed in the concluding portion of the specification. The invention, together with further objects and advantages thereof, may best be understood by reference to the following description taken in connection with the accompanying drawings in which:

Like reference numerals refer to corresponding elements throughout the several figures of the drawings.

DETAILED DESCRIPTION

Figure 1:
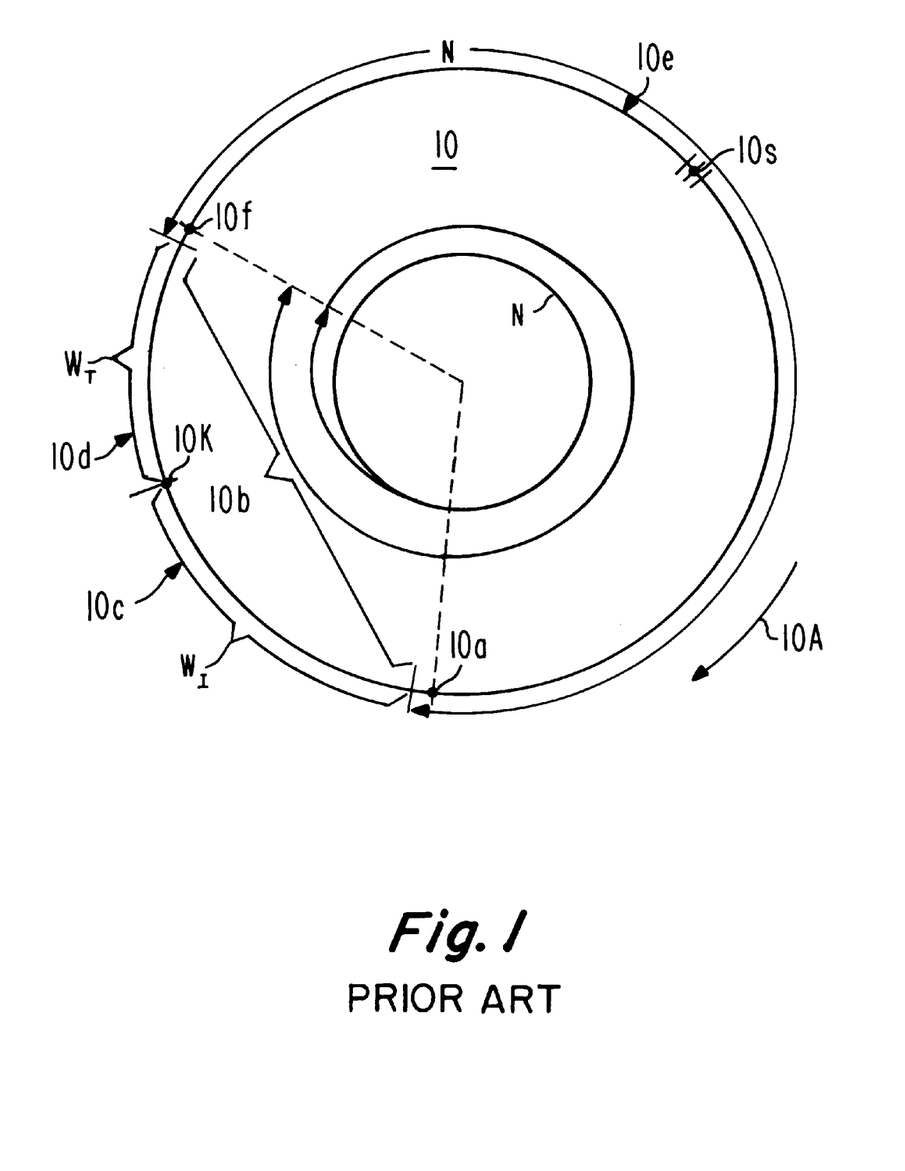
FIG. 1 is a representation of a prior-art circular frame of data symbols transmitted by a convolutional encoder, augmented to illustrate the concepts of direction, initial processing width and terminal processing width associated with the invention.

Our invention is described hereinbelow in detail for a known tail-biting convolutional code, which may be graphically represented as in FIG. 1, depicting a circular pattern 10 of symbols output from a known prior-art convolutional encoder. The data are encoded in a circular codeword or pattern of encoded symbols as the encoder is driven by the input data to a multiplicity of sequential encoder states 10s arranged around the state circle 10. For any one of the transmitted encoder states, 10k, the encoder starts from that shift register state 10k and traverses the state circle in a series of state transitions ending in the same state 10k. The decoder traverses the corresponding received circular code word (sequence of received symbols) and the additional wrap distance 10b, which is the sum of an initial wrap section 10c of width $W_I$ and a terminal wrap section 10d of width $W_T$.

The transmitted states commence, for any code word, at a first state 10a and completely traverse the state circle 10 exactly once. At the receiver, decoding is performed such that there is somewhat more than a single traversal in the direction of arrow 10A: first, the initial group 10b of states of length $(W_I+W_T)$ is decoded, then an additional N states of message 10e are decoded, to end at a final state 10f. It will be seen that there is an overlap, or duplication, of the processing of symbols corresponding to states 10b, of extent $W_I+W_T$ (where $W_I$ and $W_T$ may be chosen in one of several ways, with examples of some possible ways being described hereinbelow); the received symbols corresponding to duplicate states 10b thus both commence and terminate the augmented symbol sequence used for decoding.

Our novel decoder will use the method described and claimed in co-pending U.S. application Ser. No. 09/282,040 filed on even date herewith, and incorporated in its entirety herein by reference. The working of our decoder may be as described by a trellis 11 shown in FIG. 2. Each node 11n of the trellis used during the decoding process, contains an information element on a survivor path 11s, of those paths 11p ending at a given stage. A Viterbi algorithm is used to identify and retain, at each node 11n, only the most probable path, so as to reduce the complexity of maximum likelihood decoding of the received encoded data. It will be seen that the Viterbi algorithm will be required to process several received symbols, each corresponding to a stage in the trellis, to reach the final decode position 11f.

Figure 2:
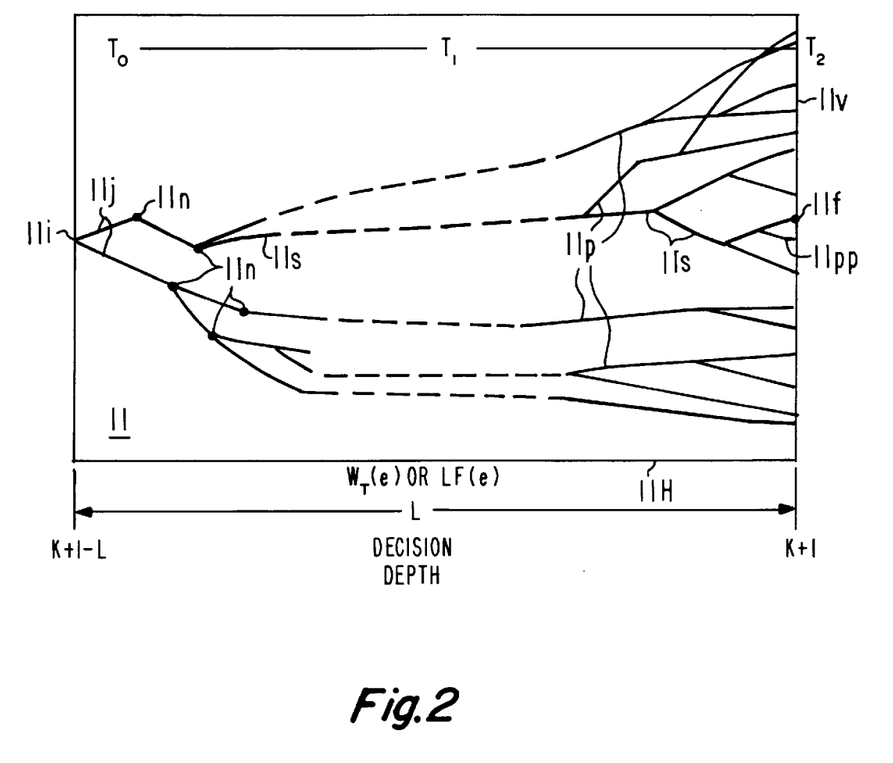
FIG. 2 is a trellis diagram representative of Viterbi algorithm observation of a code trellis during decoding.

The decoding trellis 11 has a "vertical" dimension 11V, equal to the number of possible states of the decoder, and a minimum "horizontal" dimension 11H, equal to the width that the decoder observes, which we take as equal to $W_T$. Essential characteristics of the invention lie in the method of determining the decoder terminal processing width $W_T$ and the decoder initial processing width $W_I$. In a preferred embodiment of the invention, the terminal processing width $W_T$ is set equal to a forward decision depth LF(e), for a selected e bit error correction (which is defined as the first depth in the trellis at which all paths in the incorrect path subset having a correct path initial node 11i, whether later merging to the correct path 11pp or not, are of a distance greater than 2e away from the correct path). The initial processing width $W_I$ can, but need not, be taken as the larger of an unmerged decision depth LU(e) and a backward depth LB(e), defined as follows: unmerged decision depth LU(e) is selected as the first depth or level in the trellis at which all trellis paths that never touch the correct path are of a distance of more than 2e from the correct path; and backward depth LB(e) is selected as the first depth at which all paths that merge to the correct path on a first occurrence at the rightmost node have a distance greater than 2e.

Empirical data from convolutional codes in practical use show that LU(e) is typically, but not exclusively, larger than LF(e) or LB(e).

Figure 3:
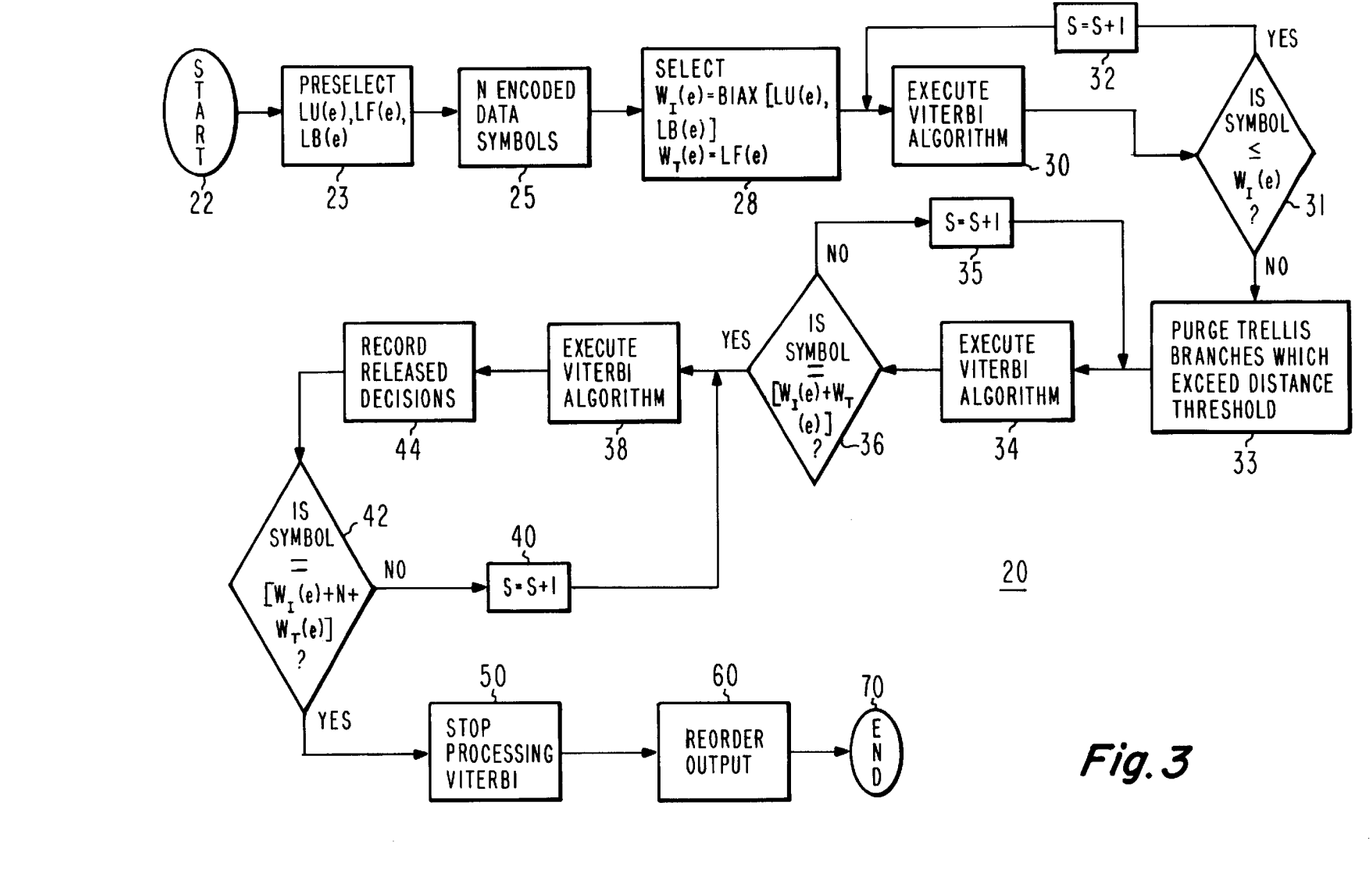
FIG. 3 is a simplified flow chart for the logical flow in the present decoder for decodation of an input digital data sequence.

Referring now to FIG. 3, our decoder follows an algorithm 20 for implementing this method: operation commences at a start step 22; and preselected values of LU(e), LF(e) and LB(e) (corresponding to the tail-biting code used to encode the data) are provided in step 23 as parameters from which the control of the decoder is derived. In step 25, the N received symbols corresponding to a transmitted code word are collected sequentially. The decoder initial and terminal processing widths $W_I$ and $W_T$ are selected in step 28. A processing algorithm of the Viterbi type is then executed without release of decisions in step 30, and the trellis stage index (which is equal to the symbol index) is compared to depth $W_I(e)$ in step 31. If depth $W_I(e)$ was (or has) not yet been reached, step 32 is entered, wherein the algorithm stage S count is advanced, and then Viterbi algorithm processing on the collection of the first $W_I(e)$ encoded data symbols continues, until achievement of the necessary depth is determined in step 31; step 33 is then entered. In the purge step 33, the paths whose metrics exceed a preselected threshold are purged. In one embodiment in which the metric is Hamming distance, this threshold is e. One method to realize the purging is to replace the metric by a large value. The Viterbi algorithm processing without release of decisions, continued in step 34, is advanced forward by $W_T(e)$ more trellis stages, as counted via step 35, until the forward edge of the Viterbi algorithm reaches the $(W_I(e)+W_T(e))$-th stage, as determined by the comparison in step 36. In the loop comprising steps 38, 44, 42, and 40, the Viterbi decoder process 38 is advanced an additional N stages, as set by step 40, until, per the determination of step 42, the symbol count equals the sum $(W_I(e)+W_T(e)+N)$, where, with each advance, a data symbol decision is released and recorded in step 44. Once the symbol count reaches the sum $(W_I(e)+W_T(e)+N)$, step 50 is entered and the processing of the Viterbi algorithm terminates. The data symbols are reordered to the original chronological order in step 60. The reordered data symbols are output and the process ends in step 70.

Though determination of LF(e) is well known in the art, determination of the other depths have not hitherto been disclosed: LU(e) is selected, in a preferred embodiment of the invention, by: (i) extending the code trellis 11, starting from all nodes at a given trellis stage simultaneously, except for the all-zero state node; (ii) storing in memory the value associated with each state at a particular stage; (iii) comparing each path with the all-zero path, and deleting each path which merges to the all-zero path; (iv) determining the path having the least Hamming distance to the all-zero path (or least number of differences with it) among those remaining paths terminating at nodes at this stage; (v) comparing the Hamming distance of the path having the least distance with the value 2e (where e represents the preselected maximum number of correctable bit errors); (vi) repeating the former sequence of steps (i)–(v) until the least distance or weight among the paths terminating at nodes at this level exceeds 2e; (vii) storing in memory the value of the trellis stage index at which this (least distance exceeds 2e) condition occurs as representative of LU(e). The depth LB(e) is selected, in accordance with a preferred embodiment of the invention, by: (i) extending the code trellis, starting from all nodes at a given stage simultaneously, except for the all-zero state node; (ii) storing in memory the value associated with each state at a particular level; (iii) comparing each path with the all-zero path, and deleting each path which merges to the all-zero path; (iv) determining the path having the least Hamming weight or distance to the all-zero path among those remaining paths terminating at nodes at this stage; (v) comparing the Hamming distance of the path having the least distance of any path entering the all-zero state with the value 2e (where e represents the preselected maximum number of correctable bit errors); (vi) repeating the former sequence of steps (i)–(v) until the least distance exceeds 2e, and, (vii) storing in memory the value of the trellis stage index at which this (least distance is less than or equal to 2e) condition occurs and adding one to the sum as being representative of LB(e).

In a preferred embodiment of the decoder apparatus according to an aspect of the invention, all survivor paths into trellis nodes at level $W_f(e)$ having a cumulative path metric exceeding e are deleted from the trellis. This may be accomplished by inserting a large positive value for the cumulative path metric at that node for such paths.

In another aspect, the (N*B) decoded data bits may be re-ordered in order to both: (1) ease of operation of the decoder to minimize decoding delay; and (2) ease of operation of the decoder to start processing the received symbol sequence with any symbol. If $X_i$ represents the i-th received symbol, the order in which the circular sequence of symbols is presented to the decoder is $X_i, X_{i+1}, X_{i+2}, \ldots, X_N, X_1, X_2, \ldots, X_{i-1+\{WI(e)+WT(e)\}}$. Use of the terminal processing width $W_T(e)$ as the decision depth results in a decoded bit sequence: $\{d^1_{i+WI(e)}, d^2_{i+WI(e)}, \ldots, d^B_{i+WI(e)}, d^1_{i+WI(e)+1}, \ldots, d^B_{i+WI(e)+1}, \ldots, d^1_N, \ldots, d^B_N, d^1_1, \ldots, d^B_1, \ldots, d^1_{i+WI(e)-1}, \ldots, d^B_{i+WI(e)-1}\}$, where the term $d^j_i$ represents the j-th bit associated with the i-th received symbol and the parameter B represents the number of symbols shifted at one time into the convolutional encoder. A reordering rule that restores the decoded bit sequence to its original chronological order is: begin with the subset of $(i+W_f(e)-1)*B$ bits, commencing with the $((N-(W_f+i)+1)*B+1)^{th}$ decoded bit, and append the remaining subset comprising the first $(N-(i+W_f(e)-1)*B)$ bits of the output sequence of the decoder. A preferred embodiment of the invention is to utilize an (N*B)-bit circular shift register to reorder the output to produce a decoded data signal in chronological order.

In accordance with our preferred embodiment of the invention, the decision depth of the decoder $W_T(e)$ is selected to be LF(e) however, when decoding most practical tail-biting convolutional codes, the decision depth $W_T(e)$ may be taken to be LU(e), without performing the comparison among LF(e), LU(e) and LB(e).

In accordance with another particular aspect of the invention, a Hamming distance metric may be utilized by the decoder in the context of hard-decision decoding. A Euclidean distance metric or correlation metric may be used for the case of an AWGN channel when decoding tail-biting convolutional codes.

Figure 4:
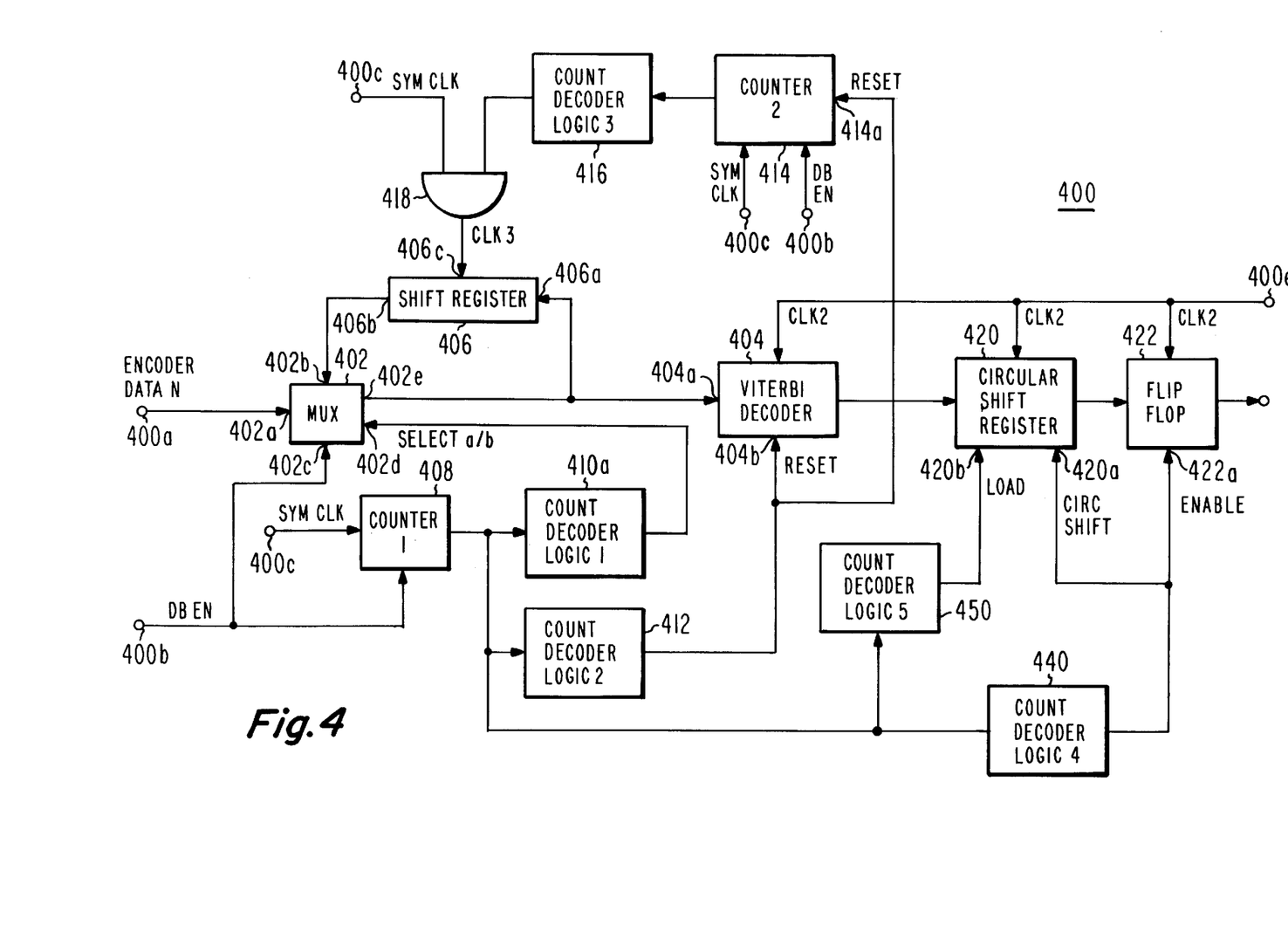
FIG. 4 is a simplified block diagram of an optimal decoding apparatus in accordance with a preferred embodiment of the invention.

One presently preferred embodiment of a novel decoder in accordance with our invention is shown in FIG. 4. Decoder 400 comprises means for carrying out each of the logical functions: there is an input means 400a for receiving a sequence of the N encoded data symbols; and means are provided for preselecting (1) the forward decision depth LF(e), (2) the unmerged decision depth LU(e), and (3) the backward decision depth LB(e) in the trellis for correcting up to the preselected number e of errors, and the decoder decision depth $W_T(e)$ responsive to the preselected depths LF(e), LU(e) and LB(e). There is a means 404 for executing a processing algorithm of the Viterbi type, having the selected decision depth $W_T(e)$ of trellis levels, on a sequence of the first LU(e) encoded data symbols for producing a trellis having LU(e) levels with each level including a plurality of possible and permissible state transitions representing, when connected, possible paths through the trellis. Means are also provided for generating a path metric for each surviving path to be extended in the trellis, representing a cumulative distance measure between that path and the received symbol sequence; the means 404 will then further act for executing the processing algorithm on the next (N+LF(e)) data symbols to extend the paths on the trellis to include trellis stage number (LU(e)+LF(e)+N), with the tail-biting final (LU(e)+LF(e)) received data symbols being identical to the first (LU(e)+LF(e)) received data symbols in the collection. Means in decoder 400 will also function for selecting at each level, beginning at level (LU(e)+LF(e)+1) and tracing back $W_T(e)=LF(e)$ levels to reach a node P, a most likely path which is a set of connected state transitions most closely corresponding to symbols received during the interval, and for recording the B bits that label the transition to node P from the node at the preceding level to produce a decoded data bit output; and for repeating the last selection and recordation processes a total of (N−1) times for each subsequent level of the extended trellis paths until level (N+LF(e)+LU(e)) is reached, to produce a decoded data bit signal (N*B)-bit output sequence.

In the illustrated presently preferred embodiment, a multiplexer (MUX) means 402 has a first input 402a connected to the first decoder input 400a for receiving the sequence of N encoded data symbols input from a channel. The sequence of received symbols passes to multiplexer means output 402e and to an input 406a of a Viterbi algorithm decoding means 404, which has a terminal processing depth of $W_T(e)=$ LF(e) trellis levels. Simultaneously, the first (LU(e)+LF(e)) encoded data symbols are applied to the input 406a and shifted into a shift register means 406, of appropriate length, from which means 406 these symbols will later be provided to a second input 402b of MUX means 402. A first counter means 408 is enabled by a Decode Block Enable (DB_EN) signal provided at a second decoder input 400b and receives a symbol clock (SYM CLK) signal from a third decoder input 400c, so as to count the number of symbols (i.e. one symbol per SYM CLK) received from the channel. A first count decoder logic means 410a receives the output of counter means 408 and reverses its logic state when a specified count threshold is reached, to generate a SELECT signal for application at a select-a/b input 402d of the MUX, to connect output 402e to second input 402b after N symbols are counted by counter 408; thus, the Viterbi decoder means 404 receives the shift register 406 contents after the first N data symbols have been initially received. Thereafter, a second count decoder logic means 412 resets both the Viterbi decoder (via its reset input 404b) and also resets a second counter logic means 414 (via a reset input 414a).

The second counter means 414 is enabled by the DB_EN signal from decoder input 400b and receives the SYM CLK signal from decoder input 400c, to count the number of symbols received from the channel; a third count decoder logic means 416 enables transmission of SYM CLK signals through an AND Gate 418; the gate 418 output is connected to the shift register control input 406c to control loading of shift register 406 so as to permit only the first (LU(e)+LF(e)) data symbols to be stored in shift register means 406.

Once all N data symbols have been received by Viterbi decoder 404, input 402d is activated to cause MUX input 402b to be connected to output 402e, and the first LU(e)+LF(e) received symbols are shifted from register 406 into the Viterbi decoder for a second time.

The output of the Viterbi decoder is ignored until LU(e)+LF(e) output symbols have been processed by the decoder 404. An N*B-bit circular shift register 420 and flip flop 422 are used here to re-order the resultant N*B output bits to produce a decoder output 400d signal in proper chronological order. This selection of Viterbi decoder output bits and their re-ordering is controlled via control signals produced by fourth and fifth count decoder logic means 440 and 450, respectively, as follows. Count decoder logic means 450 enables loading of circular shift register 420 when the received symbol count output by counter 408 is greater than, or equal to, (LU(e)+LF(e)) and less than, or equal to, (N+LU(e)+LF(e)−1). Count decoder logic means 440 enables circular shifting of circular shift register 420 when the received symbol count output by counter 408 is greater than (N+LU(e)+LF(e)−1) and less than, or equal to, (2N+LU(e)+LF(e)−3). It also enables flip-flop 422 under these conditions.

This implementation utilizes commercially available Viterbi algorithm decoder integrated circuits (such as MODEL # STEL-2030B available from Stamford Telecom), together with peripheral digital integrated circuits to implement a high speed, optimal decoder for tail-biting convolutional codes. Commercially available Viterbi decoder integrated circuits designed for popular convolutional codes (e.g. R=½, memory 6 code) can operate at a rate of 20 Mbps or more. In another embodiment, the decoder algorithm is implemented in digital signal processor assembly language code. The hardware embodiment of this aspect of the invention solves the problem, for the case of large transmission rates, that the instruction rates of commercially available programmable DSP chips are insufficient to decode received symbols in real-time.

Figure 5:
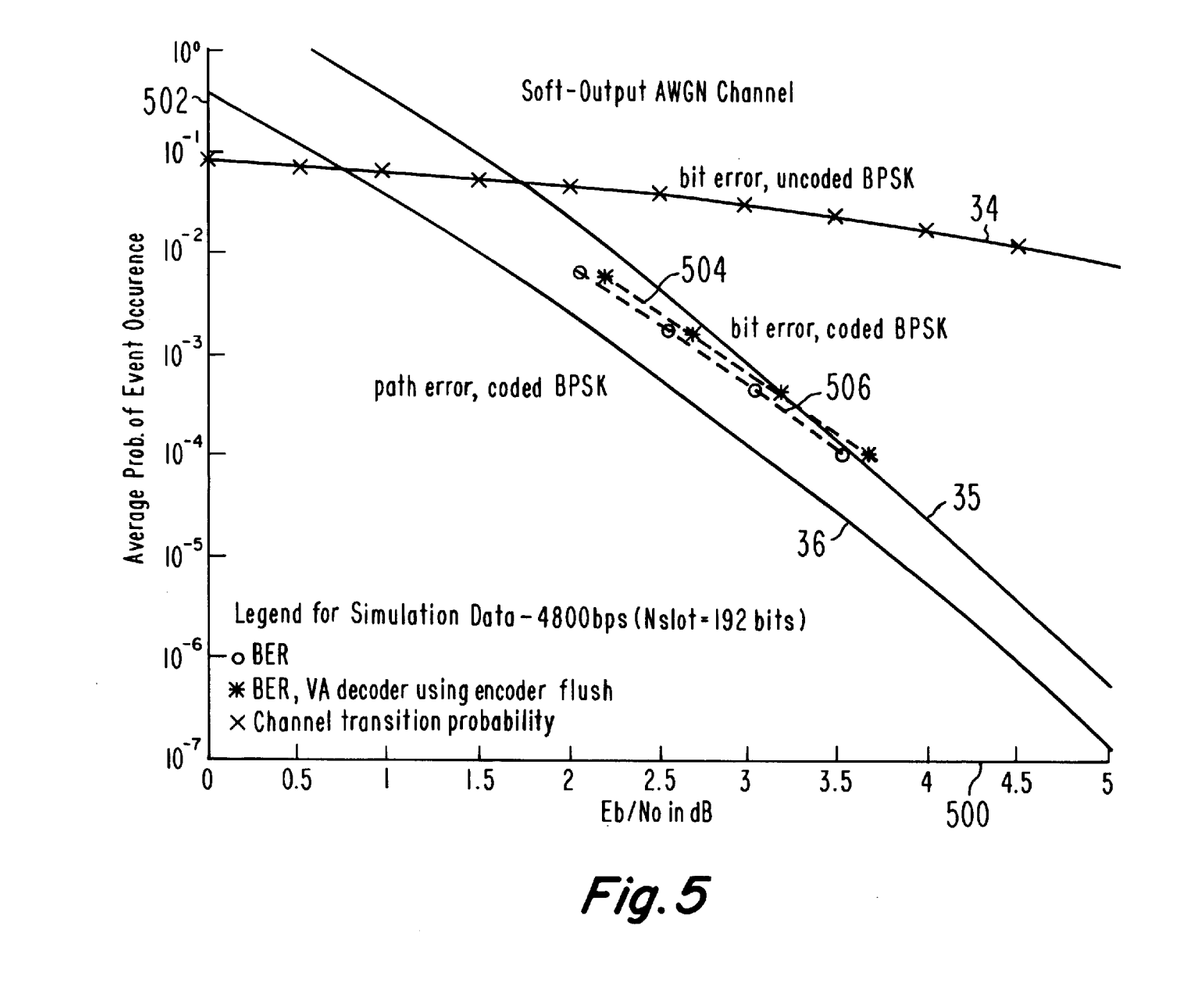
FIG. 5 is a chart illustrating the performance characteristics of the present invention, used with a 192 bit data block size.
Figure 6:
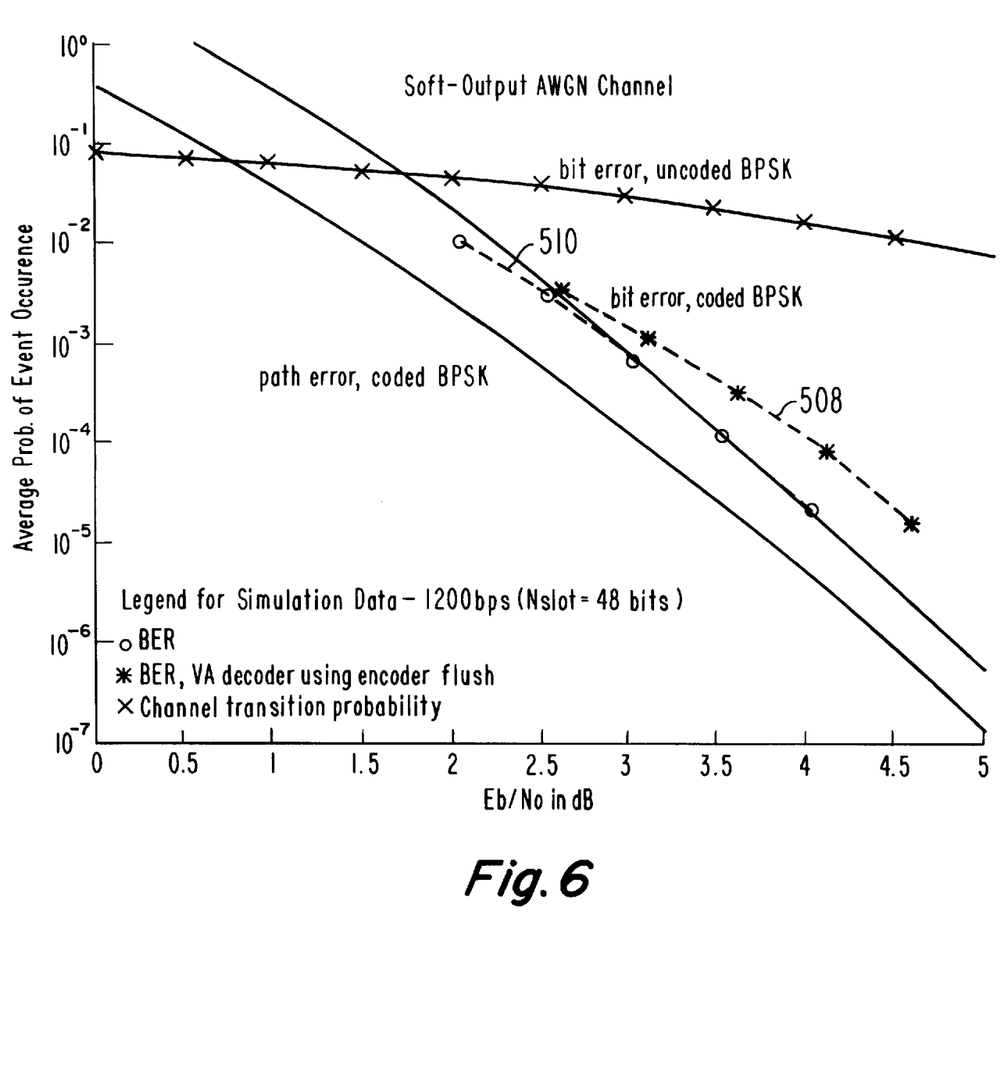
FIG. 6 is a graph of the performance characteristics of the present invention, used with a 48 bit data block size.

FIGS. 5 and 6 illustrate some performance characteristics of the invention for a soft-decision, additive-white-Gaussian-noise channel, assuming BPSK and use of rate ½ memory 6 convolutional codes. The resulting data show that the performance gain relative to encoding with appended encoder tail bits improves with decreasing block size. In FIG. 5, where SNR is plotted along abscissa 500 and average event probability is plotted along ordinate 502, a first curve 504 shows the bit-error-rate (BER) performance of standard Viterbi decoding of frames of 192 bits plus 6 termination bits. A second curve 506 depicts performance of a preferred embodiment. In FIG. 6, a curve 508 depicts standard performance with frames of 48 bits plus 6 termination bits; curve 510 is performance of a preferred embodiment. FIGS. 5 and 6 indicate approximate coding gains of 0.125 dB and 0.5 dB for data block sizes of 192 bits and 48 bits, respectively.

Figure 7:
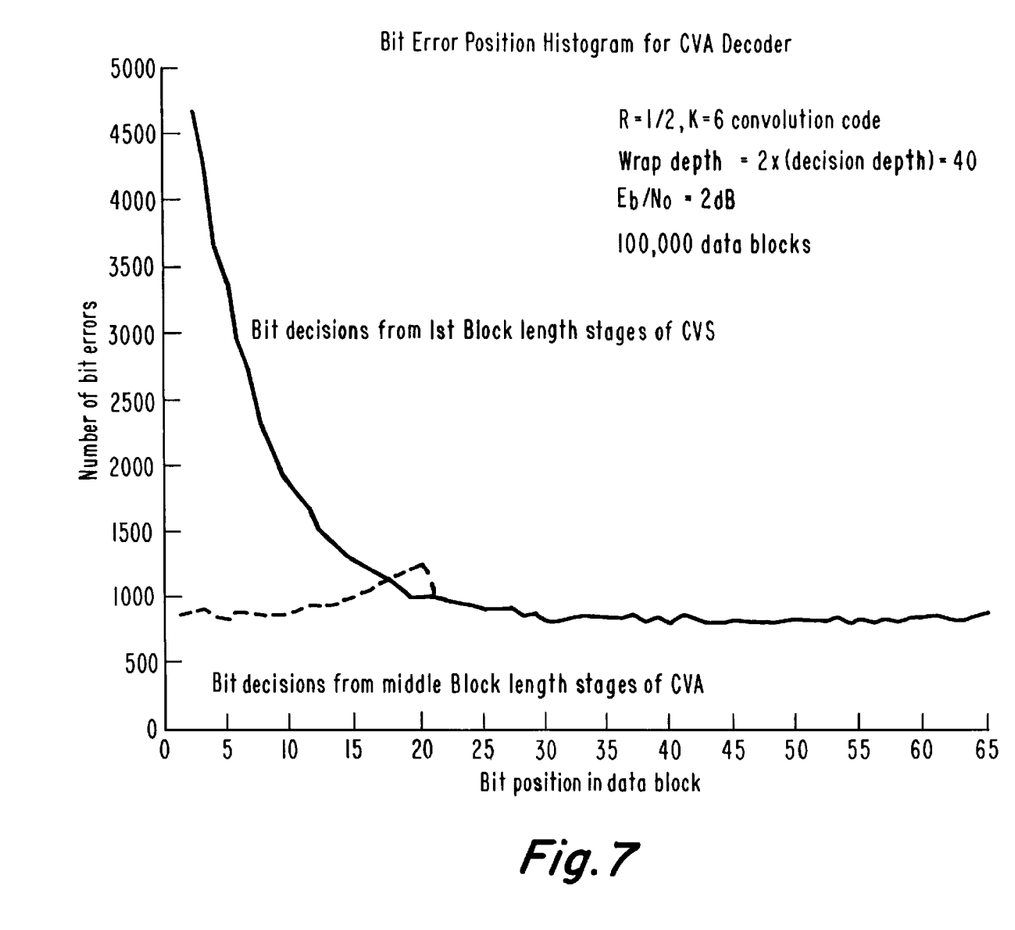
FIG. 7 is a histogram of 100,000 data blocks in which the bit errors occurring at each position in a data block of 65 bits is plotted for rate ½ memory 5 (constraint length 6) tail-biting convolutional code over a 2 dB signal-to-noise ratio channel.

FIG. 7 represents bit error position histograms obtained via computer simulation for rate ½ memory 5 (constraint length 6) tail-biting convolutional codes over a soft-decision, AWGN channel for a signal-to-noise ratio Eb/No of 2 dB. It will be seen that the most reliable decoder output is obtained in the middle N stages of the Viterbi algorithm's best-path, after processing approximately $(W_f(e)+W_T(e)+N)$ symbols from the received data symbol sequence.

A decoder (400) according to another embodiment of the invention recovers data from a digital data signal. The digital data signal includes a plurality of N data symbols. Each of the N data symbols comprises A encoder output bits, which are generated in response to the input of B data bits into an encoder for a tail-biting trellis code. The decoder (400) includes a receiving arrangement (400a) for receiving a sequence of the N encoded data symbols from a beginning symbol to a final symbol. The decoder (400) also includes an arrangement for producing a circular sequence of received symbols comprising elements 402, 406, 408, 410a, 412, 414, 416, and 418. A processor (404) is provided for executing a processing algorithm of the Viterbi type, having the decision depth L of trellis levels, on a sequence of the first $W_f(e)$ received symbols, for producing a trellis having $W_f(e)$ levels, with each level including a plurality of possible and permissible state transitions representing, when connected, one possible path through the trellis. The levels are established by the processor (404) and algorithm in response to both (a) consecutive time periods and (b) the data symbols received during the time periods. Processor 404 also includes a path generating arrangement for generating a path metric for the extension of each surviving path in the trellis, with the path metric representing a distance measurement between the extended path and the received sequence of symbols. A process continuation arrangement (408, 412, and 404b) is provided for causing the processor (404) to continue the processing algorithm on the next (N+L) data symbols, to extend the paths on the trellis to include the level $(W_f(e)+L+N)$, wherein the last $(W_f(e)+L)$ received data symbols are identical to the first $(W_f(e)+L)$ received data symbols in the collection as provided by the arrangement for producing a circular sequence of received symbols. In a preferred embodiment of the invention, the initial processing width $W_f(e)$ used in decoding is the larger of the unmerged decision depth LU(e) and the backward decision depth LB(e). A most likely path selection arrangement is provided for in processing arrangement (404), selecting at each level, beginning at level (L+1) and tracing back L levels to reach a node P, a most likely path which is a set of connected state transitions most closely corresponding to symbols received during the interval. A recording arrangement (420) is provided for recording the B bits that label the transition to node P from the node at the preceding level, to produce a decoded data bit output signal beginning with trellis level $(W_f(e)+L+1)$. A control arrangement (408, 450) is provided for causing the recording arrangement (420) to sequentially operate a total of (N−1) times for each subsequent level of the extended trellis paths until level $(N+L+W_f(e))$ is reached, to produce a decoded data bit signal (N*B)-bit output sequence.

According to a further aspect of the invention, the decoder (400) further includes a reordering arrangement (408, 420, 420a, 422, 440) for reordering the (N*B) decoded data bits to produce a decoded data bit output sequence in the chronological order corresponding to that of the encoded data bits.

While specific embodiments of the invention have been illustrated and described herein, it is realized that numerous modifications and changes will occur to those skilled in the art. For example, those skilled in the art realize that the described functions occur repetitively, operating a stream of information. The term "distance" as used in conjunction with this invention may be Euclidean distance in signal space, but it may also be metric having other dimensions. It is therefore to be understood that the appended claims are intended to cover all such modifications and changes as fall within the true spirit and scope of the invention.

What is claimed is:

1. A decoder for recovering data from a digital data signal comprising a plurality of N data symbols, each data symbol comprising A encoder output bits generated by a tail-biting trellis encoder in response to an input of B data bits, the decoder comprising:

means for receiving a sequence of the N encoded data symbols from a beginning symbol to a final symbol;

means for selecting a forward decision depth LF(e) of trellis stages for correcting up to the preselected number e of errors in the bits of the received symbols corresponding to any LF(e) consecutive trellis stages;

means for selecting an unmerged decision depth LU(e) of trellis stages for correcting up to the preselected number e of errors in the bits of the received symbols corresponding to any LU(e) consecutive trellis stages;

means for selecting a backward decision depth LB(e) of trellis stages for correcting up to the preselected number e of errors in the bits of the received symbols corresponding to any LB(e) consecutive trellis stages;

means for selecting a decoder initial processing width $W_I(e)$ responsive to the selected depths LU(e) and LB(e);

means for executing a processing algorithm of the Viterbi algorithm type, having a decision depth of L trellis stages, where L is chosen responsive to LF(e), on the received symbols for producing a trellis having a stage corresponding to each processed received symbol, each stage comprising a plurality of possible and permissible state transitions representing, when connected, possible paths through the trellis, the stages being established responsive both to consecutive time periods and to the symbols received during the time periods, the means for executing including means for generating a path metric for the extension of each surviving path in the trellis, the path metric representing a distance measure between the extended path and the received sequence of symbols, the executing means also including means for selecting, at each trellis stage beginning at stage (L+1) and tracing back L levels to reach a node P, a most likely path which is a set of connected state transitions most closely corresponding to symbols received during the interval, the executing means further including means to output the B data bits that label the transition from node P to the node at the following stage on the most likely path as the decoded data bits corresponding to the symbol received from the channel during that period;

means for forming an extended sequence of $(N+W_I(e)+L)$ received symbols obtained via a circular indexing of the N received data symbols such that the last $(W_I(e)+L)$ received symbols of the extended sequence are the same as the first $(W_I(e)+L)$ received symbols;

means for causing the executing means to sequentially process the $(N+W_I(e)+L)$ received symbols in the extended sequence;

means for recording the B decoded data bits outputted by the executing means for each trellis stage, beginning with stage $(W_I(e)+L+1)$, as a result of processing a received symbol; and means causing the recording means to operate a total of N times to produce an output sequence of (N*B) decoded data bits.

2. The decoder of claim 1, further including means for reordering the N*B decoded data bits to produce a decoded data bit output sequence in chronological order, corresponding to that of the transmitted symbols.

3. The decoder of claim 1, wherein said means for selecting depth LU(e) operates to: (1) extend a code trellis, starting from all nodes at a given level simultaneously, excluding the node representing the all zero state; (2) store in memory the value of each state at a particular level; (3) compare each trellis path with the all-zero path, and delete each trellis path which merges to the all-zero path; (4) select a least-distance path having one of the least distance and the least number of differences among the trellis paths terminating at the nodes at the level; (5) compare the number of differences of the least-distance path having a least-distance value of 2e; (6) repeat all of actions (1) through (5), inclusive, until the total number of differences of the least-distance path is in excess of 2e; and (7) then storing in memory the value of the level of the code trellis at which the least-distance path exceeds 2e.

4. The decoder of claim 1, wherein said means for selecting depth LB(e) operates to: (1) extend a code trellis, starting from all nodes at a given level simultaneously, excluding the node representing the all zero state; (2) store in memory the value of each state at a particular level; (3) compare each trellis path with the all-zero path, and delete each trellis path which merges to the all-zero path; (4) select a least-distance path having one of the least distance and the least number of differences among the trellis paths terminating at the nodes at the level; (5) compare the number of differences of the least-distance path having a least-distance value of 2e; (6) repeat actions (1) through (5), inclusive, until the total number of differences of the least-distance path is in excess of 2e; and (7) store in memory the sum of the value of the level of the code trellis at which the least-distance path exceeds (2e+1).

5. The decoder of claim 1, wherein $W_I(e)$ is selected to be the greater of LU(e) and LB(e).

6. A decoder for recovering data from a digital data signal comprising a plurality of N data symbols, each data symbol comprising A encoder output bits generated by a tail-biting trellis encoder in response to an input of B data bits, the decoder comprising:

means for receiving a sequence of the N encoded data symbols from a beginning symbol to a final symbol;

means for selecting a forward decision depth LF(e) of trellis stages for correcting up to the preselected number e of errors in the bits of the received symbols corresponding to any LF(e) consecutive trellis stages;

means for selecting an unmerged decision depth LU(e) of trellis stages for correcting up to the preselected number e of errors in the bits of the received symbols corresponding to any LU(e) consecutive trellis stages;

means for selecting a backward decision depth LB(e) of trellis stages for correcting up to the preselected number e of errors in the bits of the received symbols corresponding to any LB(e) consecutive trellis stages;

means for selecting an initial processing depth $W_I(e)$ and a terminal processing depth $W_T(e)$ responsive to the selected depths LF(e), LU(e) and LB(e);

means for forming an extended sequence of $(N+W_I(e)+W_T(e))$ received symbols obtained via a circular indexing of the N received data symbols such that the last $(W_I(e)+W_T(e))$ received symbols of the extended sequence are the same as the first $(W_I(e)+W_T(e))$ received symbols;

means for executing a processing algorithm of the Viterbi type, having the selected decision depth $W_T(e)$ trellis stages, on a sequence of the first $W_f(e)+W_T(e)$ received data symbols of the extended symbol sequence for producing a trellis having $W_f(e)+W_T(e)$ stages with each stage including a plurality of possible and permissible state transitions representing, when connected possible paths through the trellis, the stages being established responsive both to consecutive time periods and to the symbols received during the time periods;

means for generating a path metric, for the extension of each surviving path in the trellis, said path metric representing a distance measure between the extended path and the received sequence of symbols;

causing means for causing the executing means to continue the processing algorithm on the next N received symbols to extend the paths on the trellis to include the stage $(W_f(e)+W_T(e)+N)$, wherein the last $(W_f(e)+W_T(e))$ received data symbols are identical to the first $(W_f(e)+W_T(e))$ received data symbols in the collection;

selecting means for selecting at each level, beginning at level $(W_f(e)+W_T(e)+1)$ and tracing back $W_T(e)$ levels to reach a node P, a most likely path which is a set of connected state transitions most closely corresponding to the symbols received during the interval;

recording means for recording the B bits that label the transition to node P from the node at the preceding stage, beginning at stage $(W_f(e)+W_T(e)+1)$, as the decoded data output bits corresponding to the symbol received from the channel during that period; and means for causing the causing means, the selecting means, and the recording means to sequentially operate a total of (N−1) more times, once for each subsequent stage of the extended trellis paths until stage $(N+W_f(e)+W_T(e))$ is reached, to produce a decoded data bit signal (N*B)-bit output sequence.

7. The decoder of claim 6, further including means for reordering the N*B decoded data bits to produce a decoded data bit output sequence in chronological order, corresponding to that of the transmitted symbols.

8. The decoder of claim 6, wherein said means for selecting depth LU(e) operates to: (1) extend a code trellis, starting from all nodes at a given level simultaneously, excluding the node representing the all zero state; (2) store in memory the value of each state at a particular level; (3) compare each trellis path with the all-zero path, and delete each trellis path which merges to the all-zero path; (4) select a least-distance path having one of the least distance and the least number of differences among the trellis paths terminating at the nodes at the level; (5) compare the number of differences of the least-distance path having a least-distance value of 2e; (6) repeat all of actions (1) through (5), inclusive, until the total number of differences of the least-distance path is in excess of 2e; and (7) then storing in memory the value of the level of the code trellis at which the least-distance path exceeds 2e.

9. The decoder of claim 6, wherein said means for selecting depth LB(e) operates to: (1) extend a code trellis, starting from all nodes at a given level simultaneously, excluding the node representing the all zero state; (2) store in memory the value of each state at a particular level; (3) compare each trellis path with the all-zero path, and delete each trellis path which merges to the all-zero path; (4) select a least-distance path having one of the least distance and the least number of differences among the trellis paths terminating at the nodes at the level; (5) compare the number of differences of the least-distance path having a least-distance value of 2e; (6) repeat actions (1) through (5), inclusive, until the total number of differences of the least-distance path is in excess of 2e; and (7) store in memory the sum of the value of the level of the code trellis at which the least-distance path exceeds (2e+1).

10. The decoder of claim 6, wherein $W_f(e)$ and $W_T(e)$ are selected to be the greatest of LF(E), LU(e) and LB(e).

* * * * *